United States Patent [19]

Danestad

[11] Patent Number: 4,672,019

[45] Date of Patent: Jun. 9, 1987

[54] METHOD OF APPLYING A PROTECTIVE LAYER ON A SURFACE TO BE SUBJECTED TO ETCHING

[75] Inventor: Carl-Johan Danestad, Dalsjöfors, Sweden

[73] Assignee: Svensk Industrigravyr AB, Dalsjofors, Sweden

[21] Appl. No.: 834,238

[22] PCT Filed: Mar. 29, 1985

[86] PCT No.: PCT/SE85/00144

§ 371 Date: Jan. 8, 1986

§ 102(e) Date: Jan. 8, 1986

[87] PCT Pub. No.: WO85/05130

PCT Pub. Date: Nov. 21, 1985

[30] Foreign Application Priority Data

May 9, 1984 [SE] Sweden ............................... 8402497

[51] Int. Cl.$^4$ .......................... G03C 5/00; G03C 1/72
[52] U.S. Cl. .................................... 430/323; 430/308; 430/324
[58] Field of Search ............... 430/308, 304, 323, 324, 430/258

[56] References Cited

U.S. PATENT DOCUMENTS

| 3,507,653 | 4/1970 | Preddy et al. | 430/258 |
| 3,737,314 | 6/1973 | Rulett et al. | 430/306 |
| 4,388,388 | 6/1983 | Kornbau et al. | 430/323 |

Primary Examiner—John L. Goodrow
Attorney, Agent, or Firm—Dennison, Meserole, Pollack & Scheiner

[57] ABSTRACT

Particularly in the case of moulding tools for plastic products, it is desirable for these to be provided with a surface pattern which is transferred to the product. The pattern is produced by means of etching. The pattern is transferred phototechnically and the invention constitutes an improved method of performing this transfer. With the aid of an exposed screen fabric the pattern is transferred to a foil which, after coating, is provided with an adhesive layer. The coating is applied on the surface to be etched, after which the foil is removed and etching can be initiated.

4 Claims, No Drawings

METHOD OF APPLYING A PROTECTIVE LAYER ON A SURFACE TO BE SUBJECTED TO ETCHING

It is desirable when manufacturing various products, to provide one or more of their surfaces with a certain characteristic such as a pattern, a rough surface or something similar. The means available for achieving these surface characteristics on products may be moulds, rollers and tools of various types. Such means are generally made of metal and have surfaces which have been deformed in order to achieve the desired features on the surfaces of the product manufactured. To achieve the desired pattern, the surfaces of the means are generally treated by means of etching. Certain areas to be left untreated are provided with a protective layer. When the etching process is complete, the protective layer is removed and the means has acquired the distinctive pattern which is to be transferred to a product. A known method of transferring protective layers to a means is the use of a film having a light-sensitive layer and a negative with the desired pattern being placed in front of the light-sensitive layer. An exposure is then effected. When exposure is complete the unexposed parts of the light-sensitive layer are removed from the film. The remaining parts of the layer have adhesive properties. Such a film is placed against the surface of a means which is to transfer the pattern to a product being manufactured. By subjecting the film to rubbing, the exposed parts of the light-sensitive layer are transferred to the surface of the means. When transfer has been completed, the film can be removed from the surface of the means, after which the surface can be subjected to etching. After etching, the surfaces of the means has the desired pattern. The drawback of this method of transferring a protective layer to the surface of a means is that difficulties may arise in obtaining satisfactory adhesion of the protective layer.

The object of the present invention is to achieve a method by which more perfect adhesion of the protective layer is obtained. This is achieved by using a screen fabric or foil with a photo-emulsion applied on one side. A pattern is transferred to the photo-emulsion by placing a negative with the desired pattern in front of the photo-emulsion. The photo-emulsion is then subjected to exposure. The screen fabric with photo-emulsion is cleaned after exposure. The exposed screen fabric is placed with its front side against a surface such as the surface of a foil. A compound is applied on the reverse side of the screen fabric, pressed through the screen fabric and thus transferred to the surface just mentioned. The compound transferred to the surface is allowed to solidify, after which the compound transferred to said surface is provided with an adhesive layer. The coated surface is then placed against the surface of the means which is to transfer the pattern produced to a product being manufactured. The surface is pressed against the surface of said means and is perfectly adhered thereto. The coating surface is then removed and the means has acquired a surface with a perfect protective layer against the etching liquid to be used in the following etching process.

A practical example with be described in more detail in the following. According to the invention a screen fabric or screen cloth is used which may be manufactured of nylon or polyester. The mesh size in the cloth shall be 20-22. Cloths of the type described are described on page B 1 of a brochure produced by Hagberg & Winholm, Stockholm. The cloth is coated with a light-sensitive layer which may consist of the following composition: a protein-based layer sensitized with ammonium bicarbonate or a pre-sensitized film, type Ulano ®. Such a composition is described on page A 1 of a catalogue from Hagberg & Winholm, Stockholm. A negative plate containing the pattern to be transferred to a product is placed in front of the light-sensitive layer. When the negative is in position, the light-sensitive layer on the screen cloth is subjected to exposure. After exposure the screen cloth is developed and the desired pattern thus appears on the screen cloth. The front of the cloth is now placed against a thin foil, consisting of polyester or waxed paper, for instance. A compound, consisting of cellogloss for instance, is applied on the reverse side of the screen cloth. This product is described in the Schneidler Screenmaterial catalogue, page A 23. The compound is now pressed through the screen cloth and transferred to the foil against the front of the cloth. When the pattern is fully transferred to the foil, the screen cloth is removed and the foil with the compound is provided with an adhesive layer. This guarantees that the compound transferred to the foil will also be transferred to the surface of a means to be subjected to etching. The foil with adhesive and compound transferred from the screen cloth is placed with its coated surface against the surface to be subjected to etching. The reverse side of the foil is subjected to pressure, whereupon the desired protective layer is transferred to the surface of the means and the foil can then be removed. If the polyester foil is waxed before application of the protective layer, this will facilitate its release of the layer. If the surface of the means is heated to ca. 40°-50° C., the adhesive-coated protective layer will harden against the surface and an exceptionally resistant layer will be obtained. The means is then subjected to etching to obtain the desired pattern. The means may be a roller, a punch surface, a mould surface or the like. The means is generally made of metal and is designed for use with material of some type of plastic composition.

The advantage of the method according to the invention is that the use of a screen cloth enables those parts which are to constitute the protective layer to be coated in a satisfactory manner with adhesive.

I claim:

1. In a method for providing a protective layer on a surface which is to be subjected to an etching process in which the pattern of the protective layer is photographically produced on a film and is transferred to said surface by means of adhesion, the improvement comprising the steps of:
   a. coating one surface of a screen fabric with a photo-sensitive layer;
   b. exposing said photosensitive layer to light passing through a photo-negative of a desired pattern;
   c. removing the unexposed portion of said photosensitive layer;
   d. placing the coated surface of said screen fabric in contact with a foil, and applying to the reverse side of said screen fabric a protective compound which is transferred to said foil opposite the unexposed portions of said screen fabric;
   e. removing said screen fabric and providing the surface of said compound on said foil with an adhesive; and
   f. placing the adhesive on the surface of said compound in contact with a surface which is to be subjected to an etching process, and removing said foil, thereby adhering said protective compound in a desired pattern to the surface to be subjected to an etching process.

2. A method according to claim 1, characterised in that a protein-based layer sensitized with ammonium bicarbonate is used as photo-sensitive layer.

3. A method according to claim 1, characterised in that the screen fabric has approximately 90 to 100 threads/cm.

4. A method according to claim 1, characterised in that the compound pressed through is cellogloss.

* * * * *